(12) United States Patent
Howard (10) Patent No.: US 7,625,460 B2
(45) Date of Patent: Dec. 1, 2009

(54) MULTIFREQUENCY PLASMA REACTOR

(75) Inventor: Bradley J. Howard, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 280 days.

(21) Appl. No.: 10/632,628

(22) Filed: Aug. 1, 2003

(65) Prior Publication Data

US 2005/0022933 A1    Feb. 3, 2005

(51) Int. Cl.
C23C 16/00 (2006.01)
C23F 1/00 (2006.01)
H01L 21/306 (2006.01)
H05B 31/26 (2006.01)

(52) U.S. Cl. .................. 156/345.45; 156/345.43; 156/345.44; 118/723 E; 315/111.21

(58) Field of Classification Search ............ 156/345.38; 118/723 E, 723 I, 723 R
See application file for complete search history.

(56) References Cited

U.S. PATENT DOCUMENTS

| | | | |
|---|---|---|---|
| 4,585,516 A | | 4/1986 | Corn et al. |
| 5,597,438 A | * | 1/1997 | Grewal et al. ........... 156/345.38 |
| 5,656,123 A | | 8/1997 | Salimian et al. |
| 5,716,534 A | * | 2/1998 | Tsuchiya et al. .............. 216/67 |
| 5,948,215 A | * | 9/1999 | Lantsman ............... 204/192.12 |
| 6,043,607 A | * | 3/2000 | Roderick ................ 315/111.21 |
| 6,089,181 A | * | 7/2000 | Suemasa et al. .......... 118/723 E |
| 6,095,084 A | | 8/2000 | Shamouilian et al. |
| 6,235,646 B1 | | 5/2001 | Sharan et al. |
| 6,309,978 B1 | * | 10/2001 | Donohoe et al. ............ 438/710 |
| 6,491,978 B1 | * | 12/2002 | Kalyanam ............ 427/255.394 |
| 6,492,280 B1 | * | 12/2002 | DeOrnellas et al. ......... 438/714 |
| 6,533,894 B2 | | 3/2003 | Sharan et al. |
| 6,756,311 B2 | * | 6/2004 | Suzuki ....................... 438/706 |
| 6,849,154 B2 | * | 2/2005 | Nagahata et al. ....... 156/345.47 |
| 2001/0009139 A1 | * | 7/2001 | Shan et al. ............... 118/723 E |
| 2002/0139665 A1 | | 10/2002 | DeOrnellas et al. |
| 2004/0025791 A1 | * | 2/2004 | Chen et al. .................. 118/728 |

\* cited by examiner

*Primary Examiner*—Parviz Hassanzadeh
*Assistant Examiner*—Rakesh K Dhingra
(74) *Attorney, Agent, or Firm*—TraskBritt (57) ABSTRACT

A multifrequency plasma reactor includes first, second and third power generators operably coupled to at least one of an upper and lower electrode for generating power signals. The plasma reactor further includes a controller for selectively activating the power generators according to an activation profile that results in the formation of a desirable narrow gap via in a semiconductor wafer. A method of generating a plasma in the reactor for etching the semiconductor wafer is also described by way of configuring the power generators according to various activation configurations during various phases of the etching process.

21 Claims, 6 Drawing Sheets

MULTIFREQUENCY PLASMA REACTOR

BACKGROUND OF THE INVENTION

1. Field of the Invention

The present invention relates to a plasma reactor and, in particular, to a multiple frequency plasma reactor in which the frequencies and the powers associated therewith are individually controllable.

2. State of the Art

Semiconductor fabrication techniques are used to form integrated circuits on wafers and frequently include plasma-assisted processes for etching materials from the semiconductor wafer. Such plasma etching processes, also known as "dry etching," are conventionally performed in a plasma reactor which utilizes radio frequency (RF) power generators to provide power to one or more electrodes within a vacuum chamber containing a gas at a predetermined pressure as defined by a specific process. The plasma reactor also includes a matching network for efficiently coupling power from the RF power generator to the electrode within the vacuum chamber.

Dry etching of a semiconductor wafer occurs within a vacuum chamber when electric fields between the electrodes within the vacuum chamber cause electrons present in the gas within the vacuum chamber to initially collide with gas molecules. With time, the electrons gain more energy and collide with the gas molecules to form an excited or ionized species. Eventually, a plasma is formed in which excitation and recombination of the atoms with electrons within the plasma are balanced. Highly reactive ions and radical species result in the plasma and are used to etch materials from the semiconductor wafer. Electric and magnetic fields within the vacuum chamber are used to control the etching processes on the semiconductor wafer.

One conventional RF-powered plasma reactor is a single-frequency diode reactor. In a single-frequency diode reactor, RF energy is conventionally applied to the wafer table on which the semiconductor wafer is located with an electrode located above the wafer serving as a grounded electrode. In such an arrangement, the plasma forms above the wafer and the ions are accelerated downward, as a result of an electric field formed between the plasma and the negatively charged wafer, into the wafer to physically etch materials from the wafer. Different frequencies presented at the electrode cause different physical phenomena in the plasma, which may or may not be desirable for a particular semiconductor process.

Another conventional RF-powered reactor includes a dual-frequency reactor which generally permits one RF frequency to be applied to a first powered electrode located away from the wafer and which predominantly controls and powers the plasma. A second RF frequency electrode provides a bias to the wafer to control the potential (e.g., sheath potential) between the second powered electrode and the plasma. Such a configuration generally assumes a capacitively coupled arrangement, which results in the formation of a self-induced DC bias to the wafer. Dual-frequency systems generally permit higher ion densities in the plasma, which results in a higher ion flux into the wafer. Such an approach significantly affects etch rates as a higher density of ions generally induces a higher etch rate.

Yet another conventional RF-powered reactor includes a dual-frequency reactor which applies two RF frequencies to a biasing electrode to control the potential between the biasing electrode and the plasma. Another electrode is located away from the wafer and is coupled to a reference potential, such as ground. The two frequencies typically perform separate functions, with one frequency dominating the ion energy while the other frequency dominates the plasma energy.

Though various arrangements for providing power to the plasma of a plasma reactor have been described, each heretofore-described configuration includes corresponding shortcomings. Therefore, there exists a need for an improved configuration which provides for a flexible solution to the foregoing problems and deficiencies.

BRIEF SUMMARY OF THE INVENTION

A multifrequency plasma reactor and method of etching a semiconductor wafer is provided. In one embodiment, a plasma reactor includes first, second and third power generators which are coupled to corresponding upper and lower electrodes for generating power signals. The plasma reactor further includes a controller for selectively activating the power generators according to an activation profile that results in the formation of a desirable narrow gap via on a semiconductor wafer.

In another embodiment of the present invention, a plasma reactor includes a vacuum chamber which includes upper and lower electrodes therein. First, second and third power generators couple to the upper and lower electrodes, the power generators selectively activated by a controller according to a specific activation profile.

In yet another embodiment of the present invention, a method of generating a plasma in a plasma reactor for etching a semiconductor wafer during an etch process is provided. First, second and third power generators are configured and operated according to a first activation configuration during a first phase of the etch process. The power generators are reconfigured and operated according to a second activation configuration during a second phase of the etch process. In a yet further embodiment of the present invention, an etching method is provided wherein first, second and third power signals are generated at upper and lower electrodes with the power generators being individually activated to control the etching of the semiconductor wafer.

In yet another embodiment of the present invention, a method for etching a semiconductor wafer is provided. A plasma reactor is provided which includes three power generators coupled to upper and lower electrodes. A controller selectively activates the power generators and, by controlling the power generators, the etching process is further controlled.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
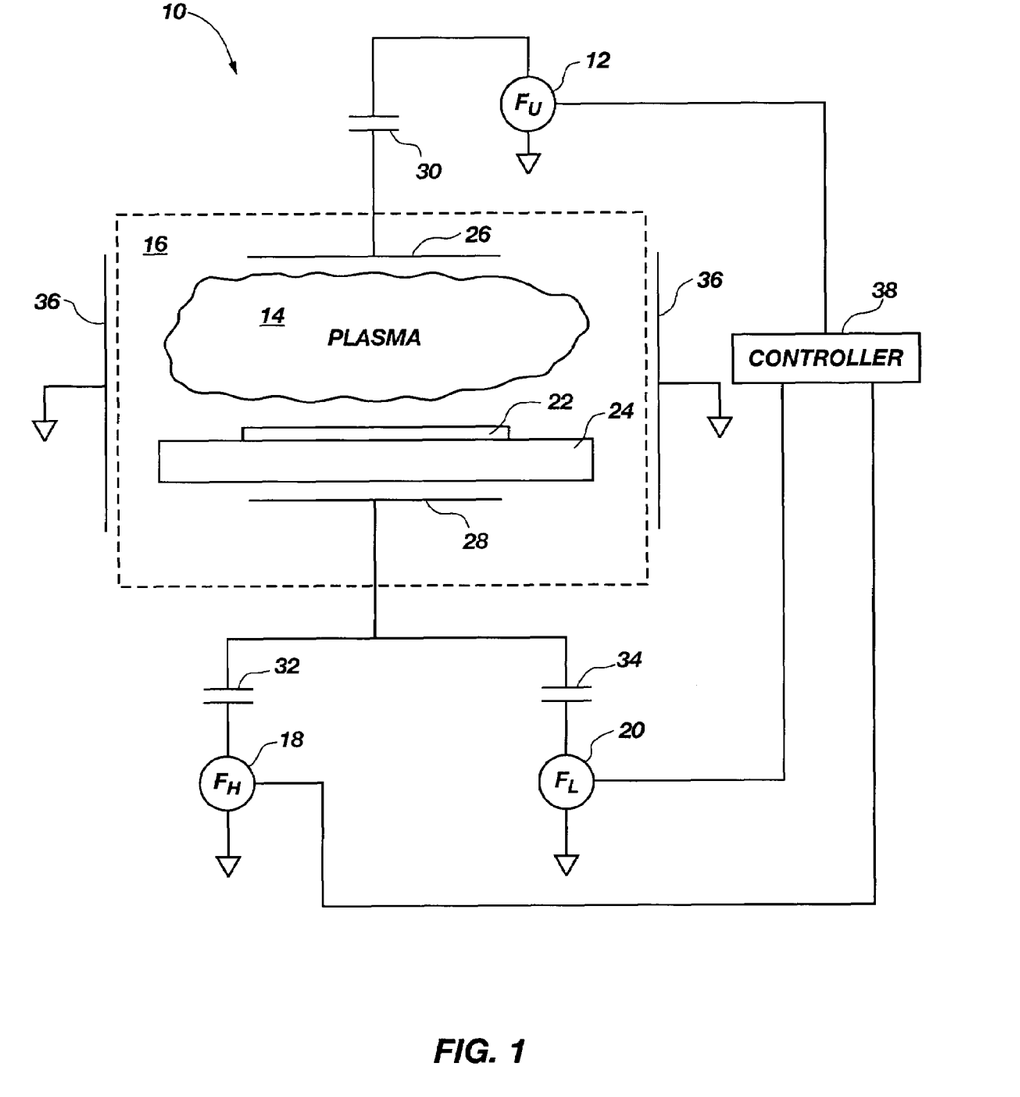
FIG. 1 is a schematic diagram of a capacitively coupled plasma reactor utilizing three power generators, in accordance with an embodiment of the present invention.

As used herein, "semiconductor" includes all bulk semiconductor substrates including silicon, silicon-on-insulator (SOI), silicon-on-sapphire (SOS), silicon-on-glass (SOG), gallium arsenide (GaAs), and indium phosphide (InP), etc. A triple-frequency plasma reactor 10 for processing semiconductor devices is shown at FIG. 1. A first, or upper, power generator 12 is utilized to generate plasma 14 within vacuum chamber 16. Plasma reactor 10 further includes a second, or lower, high-frequency power generator 18 and a third, or lower, low-frequency power generator 20 used to bias the substrate of wafer 22 as located upon wafer table 24. In the present embodiment, plasma reactor 10 is a parallel plate reactor having an upper electrode 26 and a lower electrode 28. Additionally, power generators 12, 18 and 20 are capacitively coupled via respective capacitors 30-34.

Upper power generator 12 may be configured to generate a variably powered RF signal of, by way of example and not limitation, between 1 and 2 kilowatts of power at a frequency of approximately 40 to 100 megahertz. Additionally, lower high-frequency power generator 18 may be configured, by way of example and not limitation, to generate a variably powered RF signal of approximately 1 to 2 kilowatts of power and operate at a frequency range of approximately 13.5 to 60 megahertz. Yet further, lower low-frequency power generator 20, by way of example and not limitation, may be configured to generate a variably powered RF signal of approximately 1 to 2 kilowatts of power at an operational frequency of approximately 1 to 13.5 megahertz. While specific frequencies and powers have been identified as examples, other rules may be applied for identifying frequencies and powers according to a specific process. Such rules may include guidance for selecting a frequency for the lower high-frequency power generator 18, namely that the lower high-frequency power generator 18 operates at a frequency greater than three times the frequency of the lower low-frequency power generator 20. Another rule may include that the upper power generator 12 be configured to operate at a frequency of at least that of the lower high-frequency power generator 18.

Additionally, proper operation of a plasma reactor requires sound grounding techniques. Grounding plates 36 are illustrated and grounding may further take place through the use of a matchbox (not shown) or a counter electrode (not shown), the configuration and implementation of which is appreciated by those of ordinary skill in the art. Generally, a matchbox matches the impedance with the chamber and the generator. In short, the matchbox matches the impedance on both sides of the generator in order to minimize reflected power, which otherwise would result in an ineffective coupling of power into the plasma.

The exact frequencies of operation for the power generators may be selected to correspond to internationally recognized industrial/scientific/medical (ISM) apparatus frequencies or the output frequencies of commercially available RF power supplies. Utilization of a frequency in the VHF signal band for upper power generator 12 is desirable as frequencies in this range are more effective than lower frequencies at breaking down etch gases into reactive radicals and initiating a plasma. Furthermore, the required pressure within vacuum chamber 16 may be reduced through the use of such frequencies. Additionally, higher frequencies beyond the VHF signal band also become more expensive to generate and to couple into the plasma. The triple-frequency plasma reactor 10 may further include a controller 38 operably and controllably coupled with power generators 12, 18 and 20. Controller 38 may be programmable and may control the power generators in both wattage and frequency and may be further responsive to a configured duty cycle which enables a reconfiguration of the operation of the power generators during a semiconductor wafer treatment process.

While embodiments of the present invention contemplate various operational parameters on the corresponding power generators, as defined herein, the term "inactive" or similar terminology as applied to a power generator includes the deactivation of the entire power generator and further includes the reduction in dominating power of a specific power generator. Therefore, in lieu of disabling or turning off a power generator, a reduction in power, for example, from one or more kilowatts to one or more hundreds of watts results in the same overall effect while allowing some beneficial effects from the continued operation, albeit at a reduced level, of various power generators.

Figure 2A:
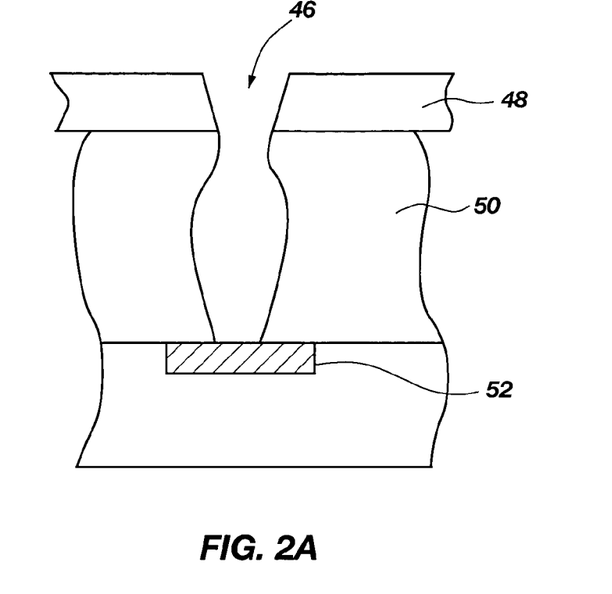
FIGS. 2A and 2B are cross-sectional diagrams illustrating the formation of narrow gap vias utilizing the plasma reactor configured according to various embodiments of the present invention.
Figure 2B:
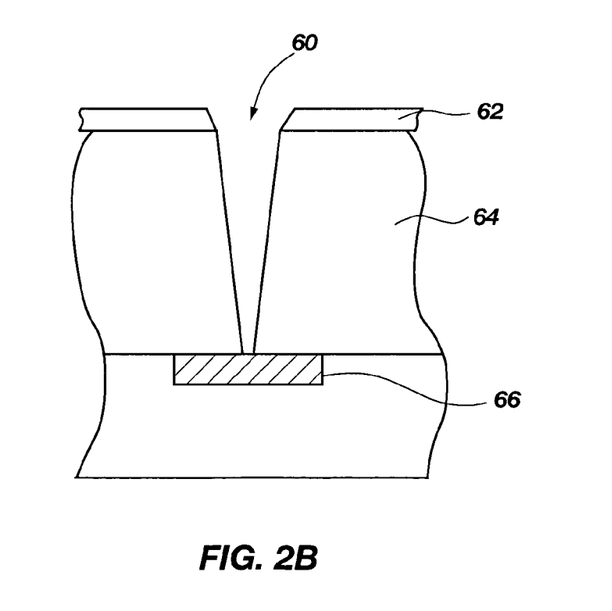
Figure 3A:
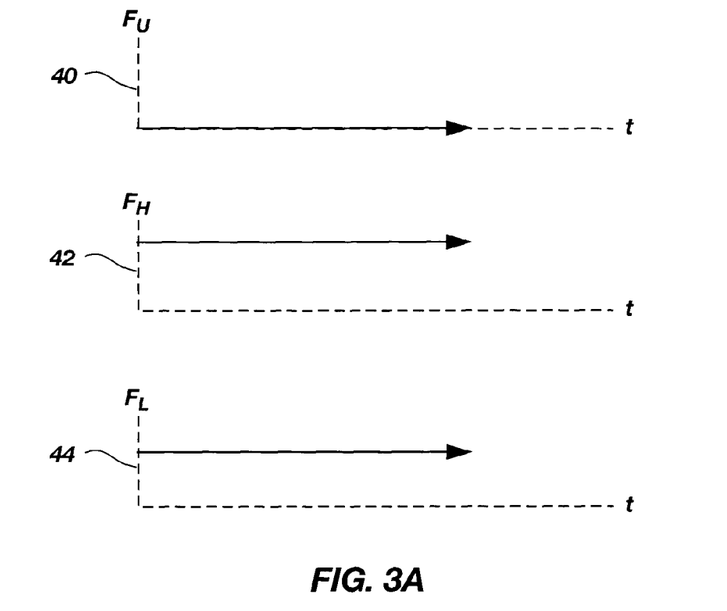
FIGS. 3A-3D illustrate power configurations of the three power generators, in accordance with embodiments of the present invention.

FIGS. 2A and 2B are illustrative cross-sectional profiles of narrow gap vias which may be formed by the triple-frequency plasma reactor of the present invention. The cross-sectional illustrations are not to scale and are presented herein for illustrative purposes only of the various narrow gap profiles attainable through various combinations of the excitation of power generators 12, 18 and 20 of FIG. 1. In FIG. 2A, the cross-sectional view as illustrated results from the configuration of triple-frequency plasma reactor 10 (FIG. 1) according to the configuration or power profile of FIG. 3A. In FIG. 3A, the generator signal 40 of upper power generator 12 (FIG. 1) is inactive while generator signal 42 of lower high-frequency power generator 18 (FIG. 1) and generator signal 44 of lower low-frequency power generator 20 (FIG. 1) are set to active or defined levels. Such a configuration results in a profile of a narrow gap via 46 which is directionally etched as defined by a mask 48 through, for example, a glass or other insulative layer 50 to a contact or target layer 52. It should be noted that narrow gap via 46 assumes a bowed profile as a result of, for example, polymer buildup around the throat of the via.

The configuration or power profile of FIG. 3A provides processing benefits including good mask or photoresist selectivity (i.e., the mask endurance through the plasma bombardment is relatively robust). Another benefit of the present configuration is that resultant narrow gap vias exhibit a desirable relatively large opening at the bottoms thereof. The present configuration further exhibits some less desirable characteristics, namely the bowing nature that occurs in the upper section of the narrow gap via as a result of the constriction at the throat portion or upper portion of the via.

Figure 3B:
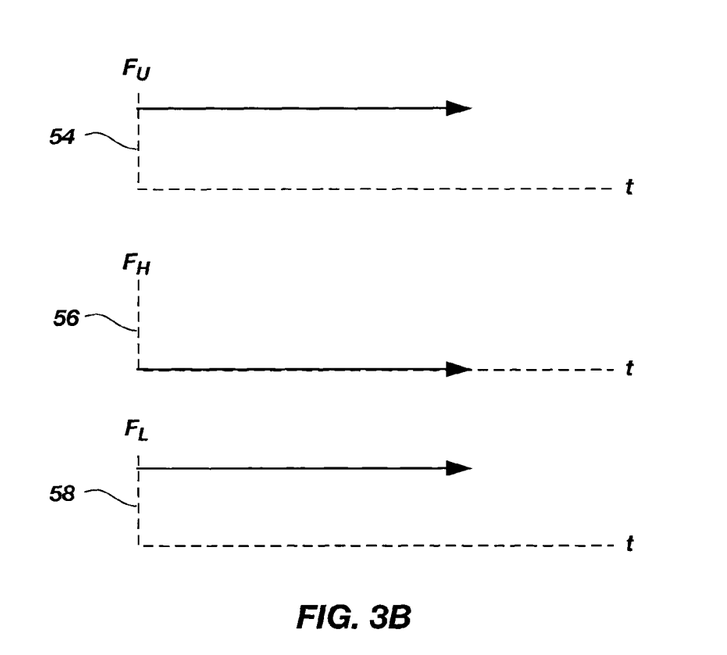

In FIG. 2B, the cross-sectional view as illustrated results from the configuration of triple-frequency plasma reactor 10 (FIG. 1) according to the power profile of FIG. 3B. In FIG. 3B, the generator signal 54 of upper power generator 12 (FIG. 1) is set to active for a defined level while generator signal 56 of lower high-frequency power generator 18 (FIG. 1) is inactive. Furthermore, generator signal 58 of lower low-frequency power generator 20 (FIG. 1) is set to an active or defined level. Such a configuration results in a profile of a narrow gap via 60 which is directionally etched as defined by a mask 62 through, for example, a glass or other insulative layer 64 to a contact or target layer 66. It should be noted that narrow gap via 60 assumes a tapered narrowing profile as the depth through insulative layer 64 increases.

The configuration or power profile of FIG. 3B provides processing benefits including a good initial profile at the throat or top of the narrow gap via. The present configuration further exhibits some less desirable characteristics, namely the appreciable narrowing of the via as the depth into the via increases. Therefore, the contact area at the bottom of the via must be accounted for with the depth and initial opening size at the top of the via.

Figure 3C:
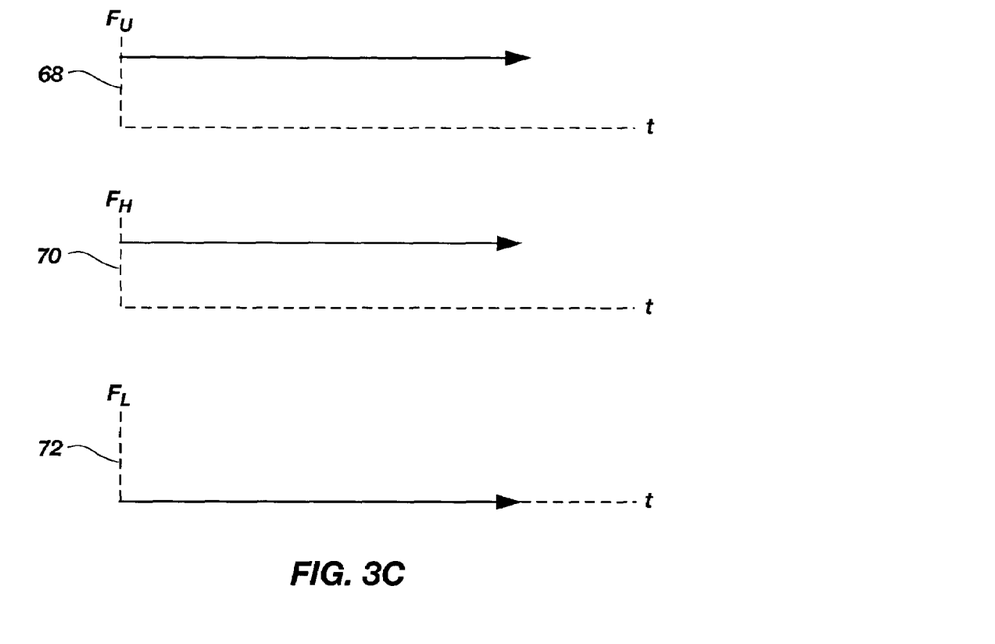
Figure 3D:
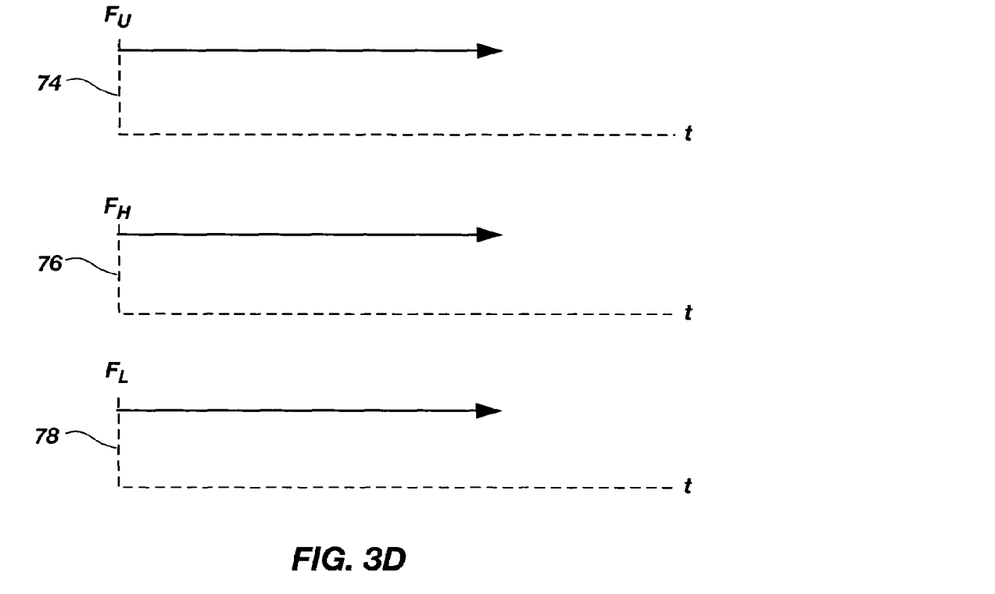

FIG. 3C and FIG. 3D represent other configurations of excitation of power generators 12, 18 and 20 of the triple-frequency plasma reactor 10. Specifically, in FIG. 3C, the generator signal 68 of upper power generator 12 (FIG. 1) is set to an active or defined level as is the generator signal 70 of lower high-frequency power generator 18 (FIG. 1). Generator signal 72 of lower low-frequency power generator 20 (FIG. 1) is inactive. Referring to FIG. 3D, all frequencies 74, 76 and 78 are set to active or defined levels for creation of plasma as used in a specific dry etching semiconductor process.

Figure 4:
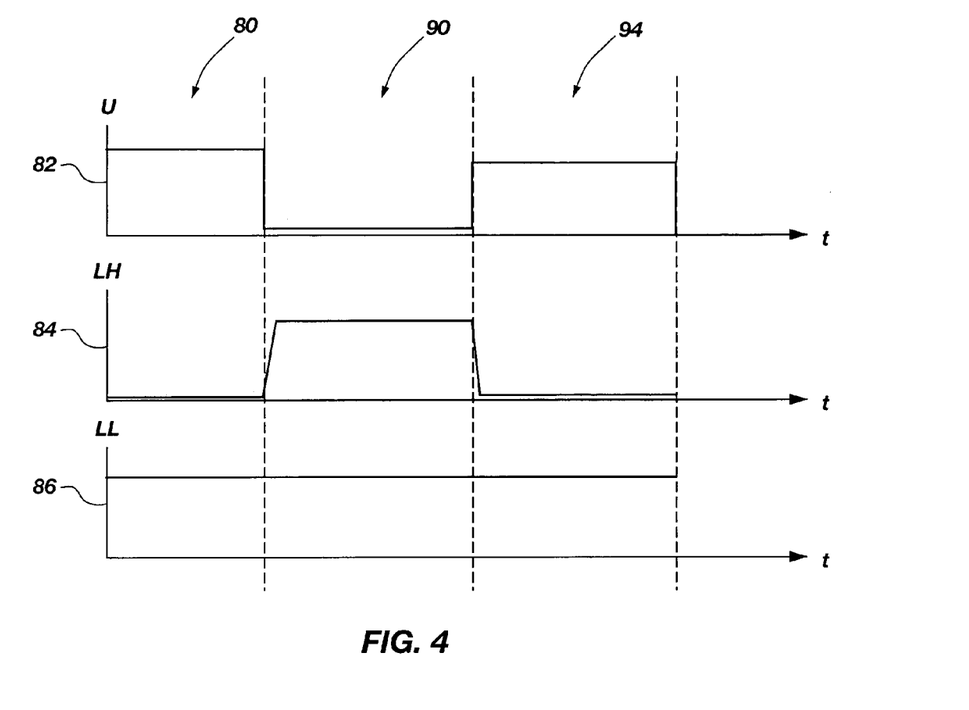
FIG. 4 illustrates a variable duty cycle of the three power generators of the plasma reactor, in accordance with an embodiment of the present invention.

FIG. 4 is a power profile of the excitation of the respective power generators of the triple-frequency plasma reactor 10, in accordance with another embodiment of the present invention. The previous embodiments have illustrated a static configuration of the various power generators of the triple-frequency plasma reactor and the corresponding narrow gap vias resulting therefrom. In the present embodiment, a dynamic excitation of power generators 12, 18 and 20 is illustrated by way of the formation of duty cycles associated with each of the power generators. Those of ordinary skill in the art appreciate that narrow gap vias are typically formed for the further formation of an electrical connection through the via to the corresponding target layer, such as a conductive trace or a pad. Ideally, the formation of a narrow gap via having sidewalls perpendicular with the target layer and with an adequate aspect ratio for accommodating a reliable filling of the narrow gap via is desirable. However, as previously illustrated in FIGS. 2A and 2B, various profiles of narrow gap vias exhibit desirable and undesirable profile characteristics.

Figure 5:
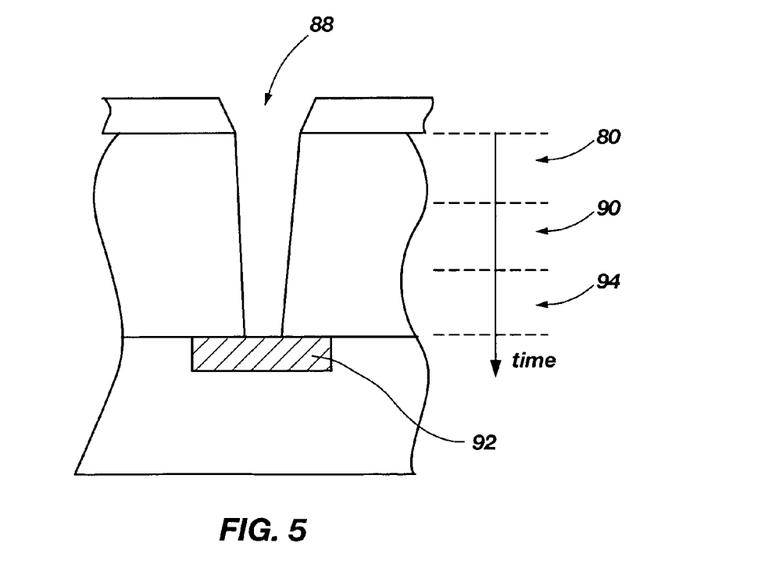
FIG. 5 is a cross-sectional diagram illustrating the formation of a narrow gap via utilizing the plasma reactor, in accordance with another embodiment of the present invention.

Formation of a narrow gap via occurs as the plasma etching process proceeds over a continuum of time as defined by an etch rate and a resulting profile. The present embodiment varies the excitation of the power generators to advantageously formulate the plasma and the resulting electrical fields to select desirable etching characteristics over an entire etching process. In FIG. 4, various duty cycles are defined for the respective frequencies. In a first phase 80, generator signal 82 of upper power generator 12 (FIG. 1) is set to an active or defined level. Generator signal 84 of lower high-frequency power generator 18 (FIG. 1) is inactive. Additionally, generator signal 86 of lower low-frequency power generator 20 (FIG. 1) is also set to an active or defined level during first phase 80. The first phase configuration of power generators 12, 18 and 20 of the triple-frequency plasma reactor 10 (all of FIG. 1) similarly corresponds to the configuration as illustrated above with regard to FIG. 3B and correspondingly with the formation of an acceptable initial opening of narrow gap via 60 of FIG. 2B. Correspondingly, the narrow gap via 88 of FIG. 5 illustrates the formation of an initial opening during first phase 80.

Returning to FIG. 4, a second phase 90 alters the excitation of power generators 12, 18 and 20 in an arrangement wherein generator signal 82 of upper power generator 12 (FIG. 1) is inactive while generator signal 84 of lower high-frequency power generator 18 (FIG. 1) and generator signal 86 of lower low-frequency power generator 20 (FIG. 1) are set to active or defined levels. Such a configuration results, during second phase 90, of a more widened profile than would otherwise be attainable through the previous configuration as illustrated with reference to first phase 80. Such a resulting narrow gap via profile is illustrated with reference to FIG. 5. As a large aperture is desirable when mating with a target layer, such as target layer 92 of FIG. 5, a reconfiguration of the excitation of power generators 12, 18 and 20 is desirable. With reference to FIG. 4, a third phase 94 reconfigures the excitation in a manner consistent with the excitation of first phase 80, namely generator signals 82 and 86 of upper power generator 12 and lower low-frequency power generator 20, respectively, are set to active or defined levels while generator signal 84 of lower high-frequency power generator 18 (FIG. 1) is inactive. Such a configuration of the excitation of the corresponding power generators enables the formation of a more desirably larger aperture when coupling with target layer 92.

Figure 6:
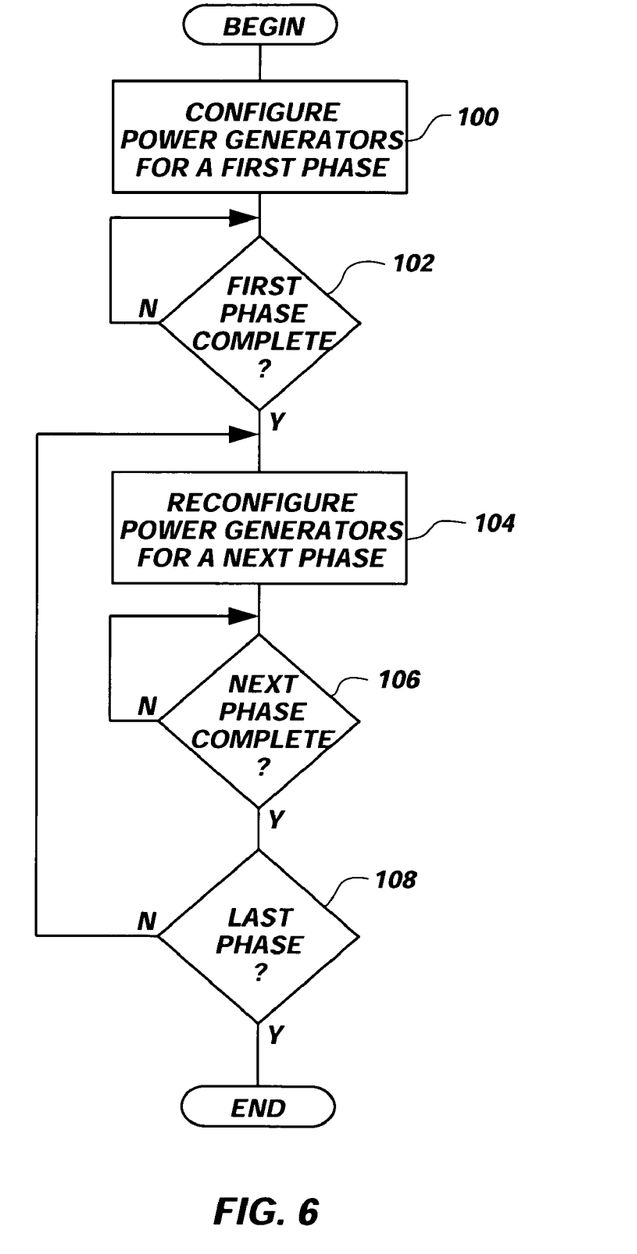
FIG. 6 is a flow chart of a variable duty cycle configuration of a plasma reactor, in accordance with an embodiment of the present invention.

FIG. 6 is a flowchart of a variable duty cycle multiple frequency plasma reactor, in accordance with an embodiment of the present invention. In FIG. 6, the power generators are configured 100 for a first phase. The status or completion of the first phase is queried 102 until the completion of the first phase. The power generators are reconfigured 104 for a subsequent phase with the duration of that phase queried 106 until its completion. Upon its completion, the determination of the last phase is queried 108 with any remaining phases being reconfigured 104 until each phase is completed.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. A parallel plate plasma reactor, comprising:
first, second and third power generators wherein the first power generator is capacitively coupled to an upper electrode and the second and third power generators are capacitively coupled to a lower electrode for supporting a wafer thereon, the first, second and third power generators being frequency-based power generators; and
a controller configured to individually selectively activate the first, second and third power generators to a plurality of activation configurations during a plurality of phases of a duty cycle of a process, wherein at least one of the plurality of activation configurations includes differently activating the second and third power generators to generate at least two different active states on the lower electrode;
wherein each of the second and third power generators are configured to independently receive a signal from the controller and independently apply energy directly to the lower electrode entirely to generate the at least two different active states thereon.

2. The plasma reactor of claim 1, wherein the second power generator is configured to operate at a frequency of at least three times an operational frequency of the third power generator.

3. The plasma reactor of claim 1, wherein the first power generator is configured to operate at a frequency of at least greater than or equal to each of an operational frequency of the second power generator and an operational frequency of the third power generator.

4. The plasma reactor of claim 1, wherein the controller is operable to place the first power generator in an inactive mode and the second and third power generators in an active mode.

5. The plasma reactor of claim 1, wherein the controller is operable to place the first and third power generators in an active mode and the second power generator in an inactive mode.

6. The plasma reactor of claim 1, wherein the controller is operable to place the first and second power generators in an active mode and the third power generator in an inactive mode.

7. The plasma reactor of claim 1, wherein the controller is operable to place the first, second and third power generators in an active mode.

8. The plasma reactor of claim 1, wherein the controller during a process is operable to configure the first, second and third power generators to a first activation configuration during a first phase thereof and to reconfigure the first, second and third power generators to a second activation configuration during a second phase thereof.

9. The plasma reactor of claim 1, wherein the controller is further operable to control power levels of the first, second and third power generators during the plurality of activation configurations.

10. The plasma reactor of claim 1, wherein each of the first, second and third power generators is capacitively coupled to one of the upper and lower electrodes.

11. The plasma reactor of claim 1, wherein the second power generator operates at a frequency of about 13.5 MHz to about 60 MHz.

12. The plasma reactor of claim 1, wherein the first power generator operates at a frequency of about 40 MHz to about 100 MHz.

13. The plasma reactor of claim 1, wherein the third power generator operates at a frequency of about 1 MHz to about 13.5 MHz.

14. A parallel plate plasma reactor, comprising:
a vacuum chamber including upper and lower electrodes therein;
first, second and third power generators wherein the first power generator is capacitively coupled to an upper electrode and the second and third power generators are capacitively coupled to a lower electrode for supporting a wafer thereon, the first, second and third power generators being frequency-based power generators; and
a controller configured to individually selectively activate the first, second and third power generators to a plurality of activation configurations during a plurality of phases of a duty cycle of a process, wherein at least one of the plurality of activation configurations includes differently activating the second and third power generators to generate at least two different active states on the lower electrode;
wherein each of the second and third power generators are configured to independently receive a
signal from the controller and independently apply energy directly to the lower electrode entirely to generate the at least two different active states thereon.

15. The plasma reactor of claim 14, further comprising a wafer table, wherein the lower electrode is coupled to the wafer table and the upper electrode is arranged above the wafer table.

16. The plasma reactor of claim 14, wherein each of the first, second and third power generators is capacitively coupled to one of the upper and lower electrodes.

17. The plasma reactor of claim 14, wherein the first power generator is capacitively coupled to the upper electrode and the second and third power generators are capacitively coupled to the lower electrode.

18. The plasma reactor of claim 17, wherein the second power generator is configured to operate at a frequency of at least three times a frequency of the third power generator.

19. The plasma reactor of claim 18, wherein the second power generator is configured to operate at a frequency of about 13.5 MHz to about 60 MHz.

20. The plasma reactor of claim 18, wherein the first power generator is configured to operate at a frequency of about 40 MHz to about 100 MHz.

21. The plasma reactor of claim 18, wherein the third power generator is configured to operate at a frequency of about 1 MHz to about 13.5 MHz.

* * * * *